(12) United States Patent
Elger

(10) Patent No.: US 6,623,231 B2
(45) Date of Patent: Sep. 23, 2003

(54) PLANT FOR PRODUCING SEMICONDUCTOR PRODUCTS

(75) Inventor: Jürgen Elger, Pyrbaum (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/963,005

(22) Filed: Sep. 25, 2001

(65) Prior Publication Data

US 2002/0102865 A1 Aug. 1, 2002

Related U.S. Application Data

(63) Continuation of application No. PCT/DE00/00942, filed on Mar. 24, 2000.

(30) Foreign Application Priority Data

Mar. 25, 1999 (DE) .......................... 199 13 628

(51) Int. Cl.[7] .............................. B65G 1/00
(52) U.S. Cl. .............................. 414/331.01
(58) Field of Search ............. 438/800; 700/121; 414/222.01, 522, 331.01

(56) References Cited

U.S. PATENT DOCUMENTS

| | | | |
|---|---|---|---|
| 4,178,113 A | * 12/1979 | Beaver et al. ............... 406/10 |
| 5,164,905 A | 11/1992 | Iwasaki et al. | |
| 5,820,679 A | 10/1998 | Yokoyama et al. | |
| 5,957,648 A | * 9/1999 | Bachrach ................. 414/217 |
| 5,980,183 A | * 11/1999 | Fosnight ............. 414/222.01 |
| 6,411,859 B1 | * 6/2002 | Conboy et al. ........... 700/101 |
| 6,468,021 B1 | * 10/2002 | Bonora et al. ............. 414/522 |

OTHER PUBLICATIONS

George Horn et al.: „What Gain from Small Batch Manufacturing?, Semiconductor Fabtech, 8th Edition, pp. 35–37, (no date indicated).

* cited by examiner

Primary Examiner—Evan Pert
(74) Attorney, Agent, or Firm—Laurence A. Greenberg; Werner H. Stemer; Gregory P. Mayback

(57) ABSTRACT

A plant for producing semiconductor products is described and has a plurality of production and measuring units in at least one clean room. Provided there is a configuration of processing stations, which has at least one production unit or measuring unit, a production buffer disposed at the latter for the deposition of semiconductor products and a handling device for the automatic delivery and outward transport of the semiconductor products. The processing stations are interconnected via a conveyor system.

14 Claims, 2 Drawing Sheets

PLANT FOR PRODUCING SEMICONDUCTOR PRODUCTS

CROSS-REFERENCE TO RELATED APPLICATION

This application is a continuation of copending International Application No. PCT/DE00/00942, filed Mar. 24, 2000, which designated the United States.

BACKGROUND OF THE INVENTION

Field of the Invention

The invention relates to a plant for producing semiconductor products.

Plants of this type can be constructed in particular as a plant for processing wafers. These plants contain a large number of production units, with which different production processes can be carried out. The production processes are, in particular, etching processes, wet chemical methods, diffusion processes and different cleaning processes, such as a chemical mechanical polishing (CMP) process. For each of the processes, one or more production units are provided, in which various production steps in a production process are carried out.

In addition, plants of this type contain a large number of measuring units. In the measuring units, the quality of processing of one or more production steps in a production process is checked.

The entire production process is subject to strict cleanness requirements, so that the production units and the measuring units are disposed in a clean room or in a system of clean rooms.

The wafers are supplied to the individual production units by a transport system, in predetermined batch sizes in cassettes. In addition, the outward transport of the cassettes following the processing of the wafers is carried out by the transport system.

The transport system typically has a conveyor system that, for example, is constructed in the form of roller conveyors. Here, the cassettes with the wafers are transported lying on the roller conveyors. Alternatively, the conveyor system can also contain continuous conveyors, suspension conveyors or the like.

Such conveyor systems run linearly through the clean room. In order to ensure the supply of the cassettes with the wafers to the production units, the conveyor systems branch in a suitable way. In this way, a more or less self-contained network of roller conveyors is produced within the clean room.

In order to ensure an adequate supply of wafers to the production units and the measuring units, the transport system additionally has a storage system, which has a specific number of storage units that are distributed suitably over the clean room. Storage units of this type are typically constructed as stockers, which are attached to the conveyor system. Temporarily stored in the stockers in each case is a predefined number of cassettes with wafers. The cassettes with wafers are removed from the stockers in a suitable number as required and, via the conveyor system, are supplied to the production units and the measuring units.

The disadvantage in this case, however, is that storing the cassettes with wafers in the stockers is very time-consuming and costly.

In the publication titled "What Gain from Small Batch Manufacturing", by George Horn and William A. Podgorski in "Semiconductor Fabtech", 8th Edition, a plant structure is proposed with which the number of stockers can be reduced.

The transport system described there contains, in addition to a conveyor system, a plurality of local process buffers. In this case, a process buffer is in each case assigned to a plurality of identical production units that in each case process the same production steps in a production process. In addition, storage units with larger storage capacities are provided for a plurality of production units and measuring units supplementing a production process, if corresponding storage capacities are required for such production processes. The production processes include, for example, diffusion processes.

Although, in a plant of this type, stockers are no longer needed, the expenditure of time for storing the cassettes with wafers and removing them again is still considerable. Depending on the processing capacities of the production unit and measuring units, cassettes have to be stored temporarily in a sufficient number in the local process buffers and in the storage units that are used to supply the production units and measuring units of a production process. The cassettes have to be removed from the storage unit again and assigned to the respective production units and measuring units, in order that they can be supplied to the production units and the measuring units via the conveyor system.

SUMMARY OF THE INVENTION

It is accordingly an object of the invention to provide a plant for producing semiconductor products which overcomes the above-mentioned disadvantages of the prior art devices of this general type, which provides the simplest, most efficient and cost-effective supply of semiconductor products possible to the individual production and measuring units.

With the foregoing and other objects in view there is provided, in accordance with the invention, a plant for producing semiconductor products such as wafers. The plant includes at least one clean room and a plurality of processing stations disposed in the clean room. Each of the processing stations contains at least one unit selected from the group consisting of production units and measuring units, and a production buffer for storing the semiconductor products. The production buffer is disposed directly at the unit. Each of the processing stations also has a handling device for automatic delivery and outward transport of the semiconductor products to and from the production buffer. A conveyor system interconnects the processing stations.

The plant according to the invention has the configuration of processing stations. Each of the processing stations has at least one production or measuring unit and also a production buffer, disposed on the latter, for the storage of semiconductor products. Also provided is a handling device, which is likewise a constituent part of the processing station. By the handling device, the delivery of the semiconductor products to the production buffer, and the outward transport of the products from the buffer are respectively carried out automatically.

The individual processing stations are interconnected via a conveyor system, via which the semiconductor products are transported between the individual processing stations.

The significant advantage of the plant according to the invention is that the semiconductor products are delivered to production buffers that are disposed directly at the production or the measuring units. From the production buffers, the semiconductor products can therefore be fed directly into the production or measuring units, without any further removal from the storage unit and supply via further transport devices being necessary. Saving transport devices of this type leads to a significant saving in costs. It is particularly advantageous here that, in the process station, no storage systems such as stockers or local process buffers are provided, from which temporarily stored semiconductor products have to be removed, sorted out and supplied to the various production or measuring units. Instead, the semiconductor products on the production buffers can already be assigned to the respective production or measuring units.

Storing the semiconductor products in the production buffers therefore leads to a considerable saving in costs and to simplification of the material flow in the plant, as a result of omitting stockers and local process buffers.

A further advantage can be seen in the fact that the production buffers can be attached directly to the production or measuring units, in a space-saving way, which leads to a low requirement for space for the plant.

Finally, it is advantageous that the transport of the semiconductor products within a processing station can be carried out very quickly and without the use of any personnel. The handling device, which can be constructed in particular as a robot or rack server, automatically supplies the semiconductor products delivered by the conveyor system to the production buffers and also ensures that they are transported away to the conveyor system. In addition, the removal of semiconductor products from a production buffer, subsequent insertion into the production or measuring unit and the subsequent removal are preferably carried out automatically by robots, grippers or the like.

In a particularly advantageous embodiment, the production buffers are constructed in the form of storage racks. Storage racks of this type are cost-effective and, in addition, can be populated with semiconductor products simply and rapidly by the rack server. The storage racks are particularly advantageously disposed immediately in front of or above loading and unloading stations on the respective production or measuring units.

Therefore, not only that an extremely space-saving installation of the production buffer on the respective production or measuring unit is provided, but also that the production buffers are disposed in the immediate vicinity of the loading and unloading station which is used to supply the semiconductor products to the respective production unit and measuring unit. By this configuration, the expenditure on the transport of the semiconductor products between the loading and unloading stations and the storage rack is reduced to a minimum.

Finally, the capacities of the storage racks can advantageously be matched in a straightforward way to the requirement for semiconductor products, by a suitable selection of the size of the storage racks. It is, moreover, advantageous that the semiconductor products can be supplied to the individual storage racks on the Kanban principle. If the filling level of a storage rack falls below a predefined desired value, the storage rack is repopulated with a predefined number of semiconductor products by the rack server.

In accordance with an added feature of the invention, the handling device is a rack server.

In accordance with an additional feature of the invention, the rack server has at least two set-down surfaces. It being possible for the cassettes with the semiconductor products to be supplied to the production buffer to be set down on a first of the set-down surfaces and for the cassettes with the semiconductor products for outward transport from the unit to be set down on a second of the set-down surfaces.

In accordance with another feature of the invention, the rack server has grippers with which the cassettes with the semiconductor products can be supplied to the production buffer and removed from the production buffer.

In accordance with a further feature of the invention, drive-to positions of the unit of a respective one of the processing stations are stored as parameter values in the rack server belonging to the respective processing station.

In accordance with another added feature of the invention, a plurality of the production units and the measuring units for carrying out a production process are disposed in a respective one of the processing stations.

In accordance with another additional feature of the invention, the production units and the measuring units are each formed of at least device selected from the group consisting of machines and staff workplaces.

In accordance with another further feature of the invention, the production buffer has a level control for determining a quantity of semiconductor products stored in the production buffer. The production buffer is refilled as soon as a filling level of the production buffer falls below a predefined desired value.

In accordance with a further added feature of the invention, at least one further production buffer is provided and functions as a transfer station for the semiconductor products for a bi-directional exchange of the semiconductor products with the conveyor system.

In accordance with a concomitant feature of the invention, the further production buffer forming the transfer station has a storage rack with a predefined number of rack compartments. The rack compartments are accessible to the handling device of the processing stations and via the transfer station the semiconductor products are transported from and to the conveyor system.

Other features which are considered as characteristic for the invention are set forth in the appended claims.

Although the invention is illustrated and described herein as embodied in a plant for producing semiconductor products, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
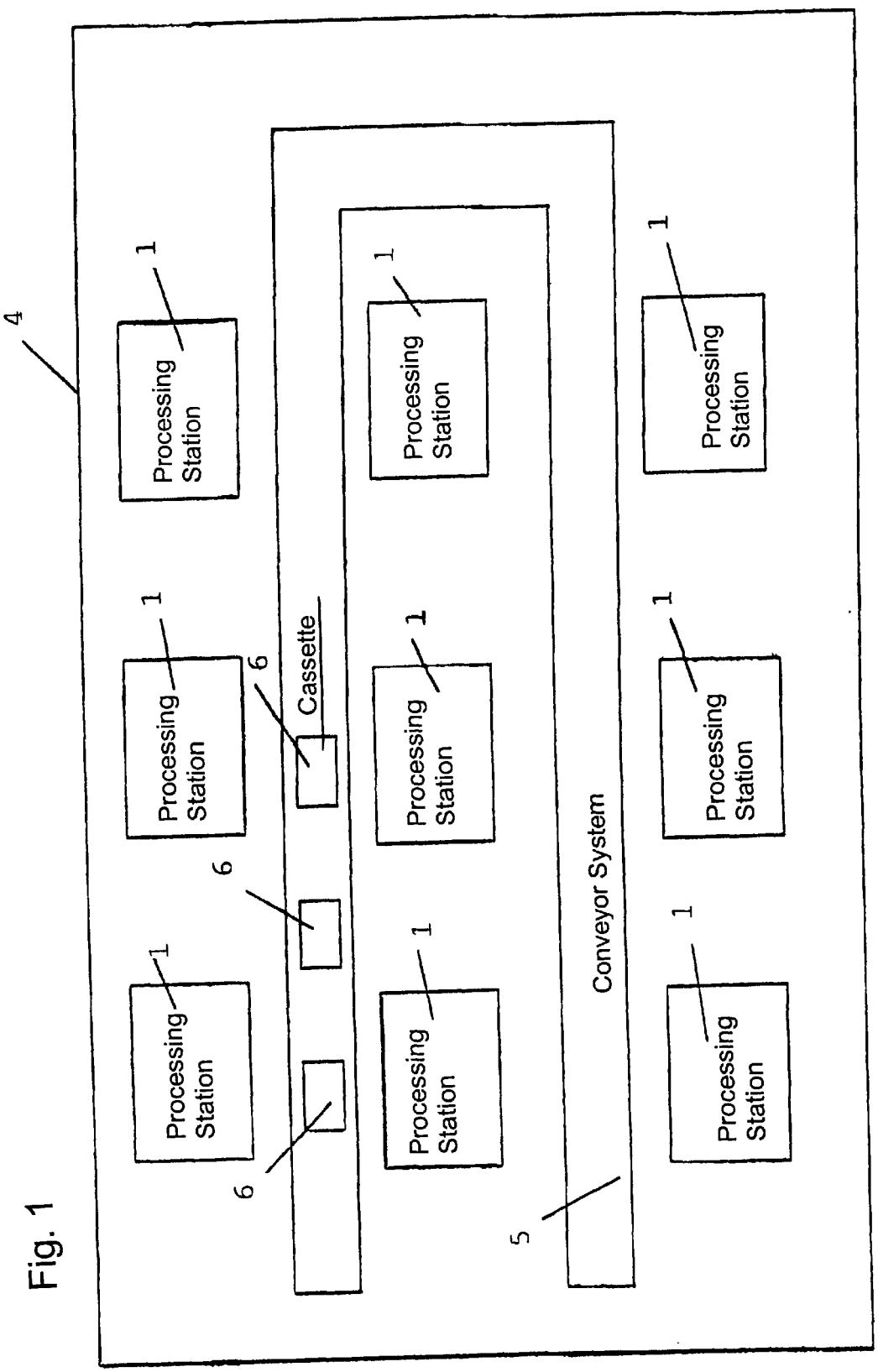
FIG. 1 is a schematic representation of a plant for producing semiconductor products, having a configuration of processing stations according to the invention.

Referring now to the figures of the drawing in detail and first, particularly, to FIG. 1 thereof, there is shown in schematic form a plant for producing semiconductor products, the present exemplary embodiment concerning a plant for processing wafers.

Figure 2:
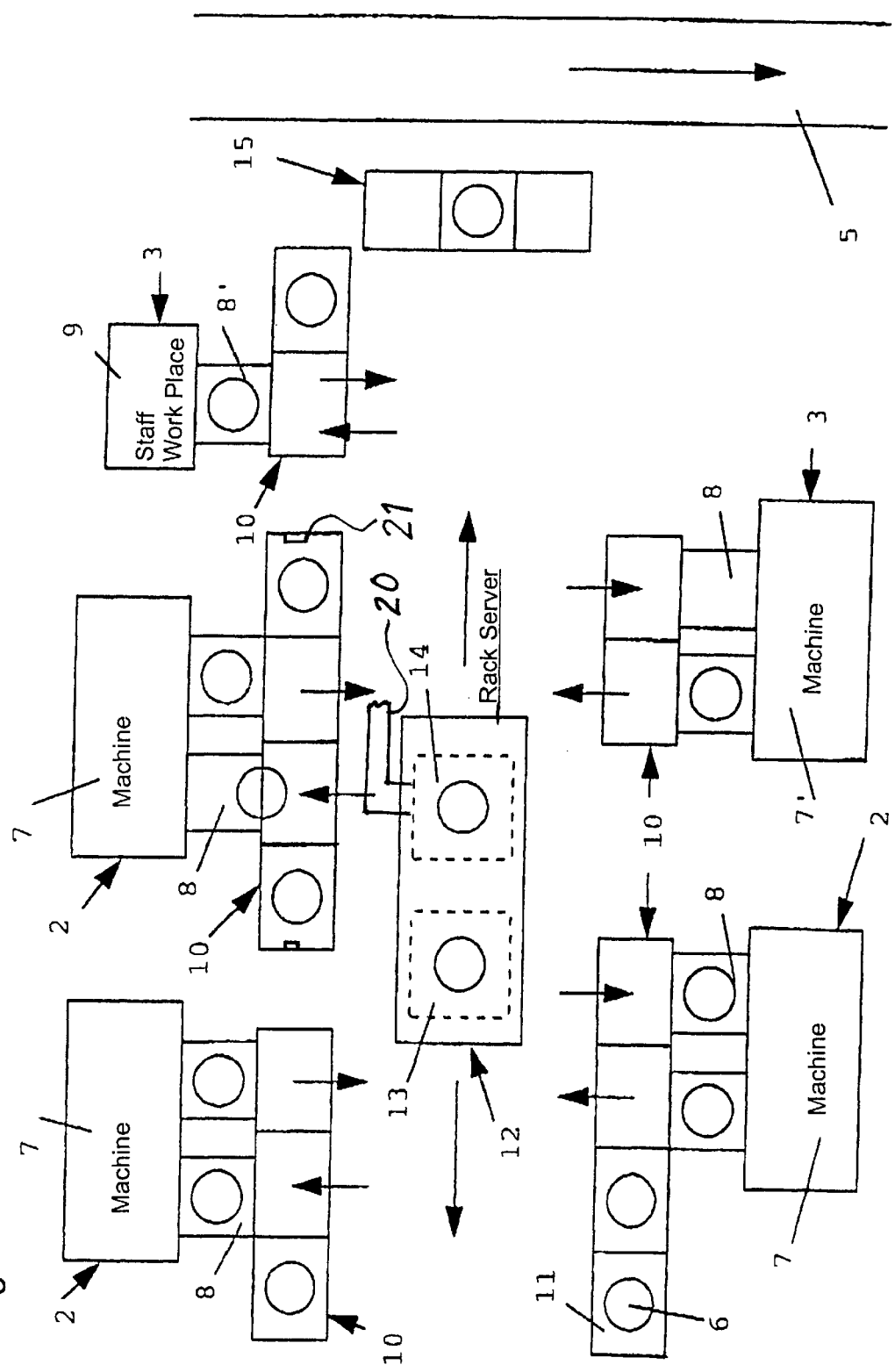
FIG. 2 is a schematic illustration of an exemplary embodiment of a processing station for the plant shown in FIG. 1.

The plant has a large number of processing stations 1, one or more production units 2 or measuring units 3 being provided in a processing station 1 (see FIG. 2). The production units 2 are used to carry out different production steps in the is production processes required for processing the wafers. The production processes include, in particular, etching processes, wet chemical processes, diffusion processes and cleaning methods. For the individual production processes, one or more production units 2 can be provided, depending on the number of production steps to be carried out.

The measuring units 3 are used to check the quality of processing of the production steps carried out in the individual production units 2.

The processing stations 1 having the individual production and measuring units 2, 3 are disposed in a clean room 4 and connected to one another by a transport system. Alternatively, the processing stations 1 can be distributed over a system of clean rooms 4.

The transport system has a conveyor system 5, which supplies wafers to the individual processing stations 1. In this case, the wafers are transported in specific batch sizes in cassettes 6. The conveyor system 5 can be constructed in the form of roller conveyors, stationary conveyors or the like. In addition, the transport system can have a non-illustrated storage system, which contains a plurality of storage units distributed in the clean room 4. The storage units can be formed in particular by stockers. The cassettes 6 with the wafers are temporarily stored in these storage units. For example, the cassettes 6 which contain the wafers that have been processed in a faulty manner in the individual production units 2 can be stored temporarily there. At suitable times, they are removed from the storage units for reworking and supplied to specific production units 2.

In a particularly advantageous embodiment, the storage capacity of the processing stations 1 and of the conveyor system 5 is configured in such a way that it is possible to dispense with the storage system.

The individual processing stations 1, as can be seen in particular from FIG. 2, each have at least one production unit 2 or measuring unit 3, a production buffer being disposed at the latter. The production buffers are used for the deposition of the cassettes 6 with the wafers. The cassettes 6 are fed to the respective production buffer automatically by the conveyor system 5 by a handling device. The cassettes 6 with wafers are removed from the production buffer as required and inserted into the production unit 2 or measuring unit 3 for processing. After processing has been carried out, the cassette 6 is removed from the production unit 2 or measuring unit 3 and deposited on the production buffer. From there, the handling device removes the cassettes 6 with the processed wafers at suitable times and supplies them to the conveyor system 5.

FIG. 2 shows an exemplary embodiment of such the processing station 1. The processing station 1 has a plurality of the production units 2 and the measuring units 3. In the production units 2 and the measuring units 3, a complete production process is carried out. The production process can be, for example, a lithography process. The production units 2 preferably substantially contain machines 7 each having a loading and unloading station 8 for the supply and outward transport of the wafers, the different production units 2 being used to apply photo resist to the wafers, for exposing the photo resist and for developing the photo resist.

In one of the measuring units 3, a check is made as to whether the multiple layers which are present in the individual wafers are located correctly one above the other. In another measuring unit 3, an optical check is made as to whether the wafers have distortions. The first measuring unit 3 is preferably formed by a machine 7' which, in turn, has one of the loading and unloading stations 8. In the present exemplary embodiment, the second measuring unit 3 is a staff workplace 9. The workplace 9 has a simplified loading and unloading station 8' in the form of a standing surface. At the workplace 9, the operating personnel check whether the processing of the wafer has been carried out correctly. Alternatively, all the measuring units 3 can be formed as the machines 7'. The processing of the wafers in the processing station 1 is then carried out without the use of any personnel.

At the respective production units 2 and measuring units 3 in the processing station 1, the production buffer is provided, in each case constructed as a storage rack 10. Each of the storage racks 10 has a predefined number of rack compartments 11. Depending on the processing capacity of the individual production and measuring units 2, 3, the storage racks 10 associated with these can have a different number of rack compartments 11. The storage racks 10 are in each case disposed at the loading and unloading stations 8, 8' of the production units 2 and the measuring units 3. Via the loading and unloading stations 8, 8', the cassettes 6 with wafers are introduced into the respective production unit 2 or the measuring unit 3 and removed from the latter.

In an embodiment which is advantageous but not illustrated, the storage rack 10 is fixed to the front wall of the production unit 2 or the measuring unit 3, directly above the loading and unloading station 8, 8'. In this case, the rack compartments 11 are loaded and unloaded with the cassettes 6 via the open front side of the storage rack 10.

In the exemplary embodiment illustrated in FIG. 2, freestanding storage racks 10 are provided, each having an open front and rear wall.

The storage racks 10 are disposed immediately in front of the loading and unloading stations 8, 8' of the production units 2 and the measuring units 3. In principle, the storage racks 10 of adjacent production units 2 and the measuring units 3 can also be supplemented to form a wall of the storage racks 10. From the rear of a storage rack 10, the cassettes 6 with wafers are removed from the storage rack 10 and supplied to the associated production unit 2 or the measuring unit 3. After processing, the cassettes 6 are correspondingly set down again on the rack compartments 11 belonging to the storage racks 10. In principle, these operations can be carried out manually. In the present exemplary embodiment, the loading and unloading operations are carried out in an automated manner by grippers, robots or the like.

In order to ensure the clear assignment of the cassettes 6, in each case specific rack compartments 11 are provided for cassettes 6 which are to be supplied to the respective production unit 2 or the measuring unit 3. Other rack compartments 11 are provided for the cassettes 6 that are to be transported away from the production unit 2 or the measuring unit 3. The appropriate rack compartments 11 are advantageously also identified differently. In this case, depending on the throughput that is achieved by a production unit 2 or the measuring unit 3, the rack compartments 11 are provided in an appropriate number for the supply and the outward transport.

The handling device, which performs the transport of the cassettes 6 from the conveyor system 5 to the storage racks 10 and their outward transport, is formed by a rack server 12 in the present exemplary embodiment. Instead of this, in principle a robot could also be provided as the handling device.

In this case, the production units 2 and the measuring units 3 with the storage racks 10 disposed in front of them are disposed in two rows that run parallel, so that the rack server 12 can be moved along the gangway between the production units 2 and the measuring units 3. The width of the gangway is matched to the width of the rack server 12. By this configuration, the rack server 12 only has to be moved along a rectilinear path in order to move to all the production units 2 and the measuring units 3. The rack server 12 is a driverless transport vehicle that is, rail-bound or freely mobile, can be moved in the processing station 1.

The rack server 12 has two separate set-down surfaces 13, 14, on which the cassettes 6 with wafers can be put down. In principle, a plurality of set-down surfaces 13, 14 can also be provided. Set down on the first set-down surface 13 are the cassettes 6 which are to be supplied to the storage rack 12 from the production unit 2 or the measuring unit 3. The second set-down surface 14 is used to accommodate the cassettes 6 from a corresponding storage rack 10.

As a result, when the rack server 12 is positioned in front of the storage rack 10, both the cassettes 6 with wafers removed from the rack server 12 can be put down on the storage rack 10, and the cassettes 6 with wafers can also be picked up from the storage rack 10. In order to carry out the loading and unloading operations, a partially illustrated gripper 20 is provided on the rack server 12.

The positioning of the rack server 12 at the storage racks 10 of the individual production units 2 and the measuring units 3 is expediently carried out via a control system in the rack server 12. In this case, the drive-to positions of the production units 2 and the measuring units 3 are expediently stored as parameter values in the control system. By changing the parameter values, a travel path of the rack server 12 can be adapted simply and quickly to any possible change in the construction of the processing station 1.

Via the control system of the rack server 12, regulation of the level of the storage racks 10 on the Kanban principle can also be performed in a simple way. If the filling of individual storage racks 10 falls below a predefined desired value, as detected by level control sensors 21, then a specific number of the cassettes 6 is then put into the storage rack 10 by the rack server 12.

The rack server 12 forms the connection between the conveyor system 5 of the plant and the production and measuring units 2, 3 of the processing station 1. In the simplest case, the cassettes 6 with the wafers will be picked up directly from the conveyor system 5 via the rack server 12 and supplied to the conveyor system 5 again.

In the exemplary embodiment illustrated in FIG. 2, a transfer station 15 formed by a storage rack 10 is provided at the output from the processing station 1, immediately in front of the conveying system 5. In a similar way to the storage racks 10 of the production units 2 and the measuring units 3, the cassettes 6 are taken off the conveyor system 5 by a non-illustrated gripper and deposited into appropriately identified rack compartments 11 in the transfer station 15. Deposited in other, likewise identified rack compartments 11 are the cassettes 6 that have been processed in the processing station 1. From the rack compartments 11, the cassettes 6 are supplied to the conveyor system 5 again by use of the grippers. The rack server 12 can be positioned at the rear of the transfer station 15 in order to remove from the latter cassettes 6 which are to be processed in the processing station 1. In a corresponding way, by use of the rack server 12, the cassettes 6 with processed wafers are deposited in the rack compartments 11 provided for this purpose in the transfer station 15.

I claim:

1. A plant for producing semiconductor products, including wafers, the plant comprising:
    at least one clean room;
    a plurality of processing stations disposed in said clean room, each of said processing stations containing at least one unit selected from the group consisting of production units and measuring units, said unit having a loading station and an unloading station, each of said processing stations having a production buffer for storing cassettes containing the semiconductor products, said production buffer disposed such that said loading station and said unloading station remove the cassettes from said production buffer and introduce the cassettes into said unit or remove the cassettes from said unit;
    a handling device formed as a rack operating device for automatic delivery and outward transport of the semiconductor products to and from said production buffer, said rack operating device having at least two spaces, a first of said spaces for supplying said cassettes to said production buffer and a second of said spaces for receiving said cassettes from said production buffer; and
    a conveyor system interconnecting said processing stations.

2. The plant according to claim 1, wherein said production buffer is formed of a storage rack having a plurality of rack compartments.

3. The plant according to claim 2, wherein said storage rack is disposed immediately in front of said loading and unloading station.

4. The plant according to claim 2, wherein said storage rack is disposed above said loading and unloading station.

5. The plant according to claim 2, wherein separate ones of said rack compartments being provided for a supply and an outward transport of said cassettes.

6. The plant according to claim 5, wherein said rack compartments are identified in accordance with their functions.

7. The plant according to claim 6, wherein said unit has a processing capacity and in dependence on the processing capacity of said unit, said cassettes with the semiconductor products for the outward transport from said unit are provided in said storage rack on a predefined number of said rack compartments, and in that said cassettes with the semiconductor products delivered by said handling device can be deposited on a predefined number of said rack compartments.

8. The plant according to claim 1, wherein said rack operating device has grippers with which said cassettes with the semiconductor products can be supplied to said production buffer and removed from said production buffer.

9. The plant according to claim 7, wherein drive-to positions of said unit of a respective one of said processing stations are stored as parameter values in said rack operating device belonging to said respective processing station.

10. The plant according to claim 1, wherein a plurality of said production units and said measuring units for carrying out a production process are disposed in a respective one of said processing stations.

11. The plant according to claim 10, wherein said production units and said measuring units are each formed of at least device selected from the group consisting of machines and staff workplaces.

12. The plant according to claim 1, wherein said production buffer has a level control for determining a quantity of semiconductor products stored in said production buffer, said production buffer being refilled as soon as a filling level of said production buffer falls below a predefined desired value.

13. The plant according to claim 1, including at least one further production buffer functioning as a transfer station for the semiconductor products for a bi-directional exchange of the semiconductor products with said conveyor system.

14. The plant according to claim 13, wherein said further production buffer forming said transfer station has a storage rack with a predefined number of rack compartments, said rack compartments are accessible to said handling device of said processing stations and via said transfer station the semiconductor products are transported from and to said conveyor system.

* * * * *